United States Patent
Vanderlinde

(10) Patent No.: US 6,777,678 B1
(45) Date of Patent: Aug. 17, 2004

(54) SAMPLE-STAGE FOR SCANNING ELECTRON MICROSCOPE

(75) Inventor: William E. Vanderlinde, Columbia, MD (US)

(73) Assignee: The United States of America as represented by the National Security Agency, Washington, DC (US)

( * ) Notice: Subject to any disclaimer, the term of this patent is extended or adjusted under 35 U.S.C. 154(b) by 0 days.

(21) Appl. No.: 10/666,822

(22) Filed: Sep. 17, 2003

(51) Int. Cl.[7] .......................... H01J 37/28; H01J 37/256
(52) U.S. Cl. ...................... 250/310; 250/311; 250/306; 250/440.11; 250/492.3
(58) Field of Search ................................ 250/310, 311, 250/306, 440.11, 492.3

(56) References Cited

U.S. PATENT DOCUMENTS

| 4,596,929 A | 6/1986 | Coates et al. |
| 4,627,009 A | 12/1986 | Holmes et al. |
| 5,179,280 A | 1/1993 | Wang |
| 5,510,624 A | 4/1996 | Zaluzec |
| 5,768,339 A | * 6/1998 | O'Hara .......................... 378/147 |
| 6,025,592 A | 2/2000 | Knowles et al. |
| 6,407,850 B1 | 6/2002 | Rojo et al. |

OTHER PUBLICATIONS

Joseph I. Goldstein et. al., Scanning Electron Microscopy and X–Ray Microanalysis, 1992, Plenum Press, New York, pps 267–270.

* cited by examiner

Primary Examiner—Nikita Wells
(74) Attorney, Agent, or Firm—Robert D. Morelli

(57) ABSTRACT

The present invention is a sample-stage for a scanning electron microscope. The sample-stage has a base and a horizontal support member, where there is an aperture in the horizontal support member. A vertical support member abuts the base on one end and the horizontal support member on the other end so that the vertical support member is under, and at an angle to, the aperture in the horizontal support member. A collimator, having an aperture in alignment with the aperture in the horizontal support member, abuts the top of the horizontal support member. A first reflector abuts the surface of the vertical support member under the aperture in the horizontal support. A second reflector abuts a portion of the top surface of the base that is not covered by the vertical support member.

10 Claims, 2 Drawing Sheets

SAMPLE-STAGE FOR SCANNING ELECTRON MICROSCOPE

FIELD OF THE INVENTION

The present invention relates, in general, to radiant energy and, in particular, to analyte supports.

BACKGROUND OF THE INVENTION

Optical techniques cannot be used to observe extremely fine features such as those on the surface of a semiconductor integrated circuit, because the wavelength of visible light is too large to distinguish such fine features. Therefore, particles in the form of an electron beam, or e-beam, is used because an e-beam can be generated that with a sufficiently small wavelength to distinguish such features.

Three types of e-beam microscopes have been developed: Transmission Electron Microscope (TEM), Scanning Transmission Electron Microscope (STEM), and Scanning Electron Microscope (SEM). Each of these microscopes operated by accelerating an e-beam of toward the surface of an object to be viewed. When the e-beam strikes the surface of the object, secondary electrons are emitted from the object. To prevent an electric charge from accumulating on the surface, the object is often coated with a metal prior to being bombarded with an e-beam. The secondary electrons are then collected by a detector called a secondary emission detector (SED). The detected secondary emission is then coordinated with the excitation signals applied to the e-beam to extract an image of the object.

The TEM, which is very expensive, generates an unmovable e-beam spot onto an object of interest to produce an image of very high resolution. The STEM, which is also very expensive, generates an e-beam that is scanned over an object of interest to produce an image of very high resolution. The SEM, which is approximately ten times less expensive than either a TEM or a STEM, generates an e-beam that is scanned over the object of interest to produce an image of high resolution, but not as high as that of either a TEM or a STEM.

In a book entitled "Scanning Electron Microscopy and X-ray Microanalysis, a Text for Biologists, Materials Scientists, and Geologists, 2Ed.," by Joseph I. Goldstein et al., published in 1992, pps. 267–270, it was disclosed that the resolution of a STEM may be achieved in a SEM by mounting a thin sample of the item to be viewed across an opening in a sample stage, placing either a scintillator coupled to a light pipe or a solid-state detector below the sample stage. The disadvantages of this method are that lateral scattering of electrons passing through the sample will determine the upper limit of image resolution and placing a scintillator and light-pipe or solid-state device under the sample stage requires modifications to the SEM which result in time-consuming setup procedures. Goldstein et al. also suggests using a tilted scattering surface of a high-atomic number. The disadvantage of this method is that lateral scattering of electrons passing through the sample will determine the upper limit of image resolution.

U.S. Pat. No. 4,596,929, entitled "THREE-STAGE SECONDARY EMISSION ELECTRON DETECTION IN ELECTRON MICROSCOPES," discloses a device that uses two grids to maximize the amount of secondary emission detected by a scintillator. The present invention does not employ two such grids. U.S. Pat. No. 4,596,929 is hereby incorporated by reference into the specification of the present invention.

U.S. Pat. No. 4,627,009, entitled "MICROSCOPE STAGE ASSEMBLY AND CONTROL SYSTEM," discloses a device for rotating and tilting a sample in a non-eucentric manner and compensate for the same so that an inspection point is within the field of view. The present invention does not rotate and tilt a sample in a non-eucentric manner and compensate for the same so that an inspection point is within the field of view. U.S. Pat. No. 4,627,009 is hereby incorporated by reference into the specification of the present invention.

U.S. Pat. No. 5,179,280, entitled "COMPUTER CONTROL OF THE ELECTRON MICROSCOPE SAMPLE STAGE," discloses a device for tilting a sample so that a plurality of different orientations are displayed stereoscopically with a spot representing a current orientation. The present invention does not tilt a sample so that a plurality of different orientations are displayed stereoscopically with a spot representing a current orientation. U.S. Pat. No. 5,179,280 is hereby incorporated by reference into the specification of the present invention.

U.S. Pat. No. 5,510,624, entitled "SIMULTANEOUS SPECIMEN AND STAGE CLEANING DEVICE FOR ANALYTICAL ELECTRON MICROSCOPE," discloses a device for cleaning both a sample stage, a sample, and an interior of an analytical electron microscope. The present invention does not clean either a sample stage, a sample, or an interior of an analytical electron microscope. U.S. Pat. No. 5,510,624 is hereby incorporated by reference into the specification of the present invention.

U.S. Pat. No. 6,025,592, entitled "HIGH TEMPERATURE SPECIMEN STAGE AND DETECTOR FOR AN ENVIRONMENTAL SCANNING ELECTRON MICROSCOPE," discloses a device that can heat a sample to 1500 degrees Celsius. The present invention does not heat a sample to 1500 degrees Celsius. U.S. Pat. No. 6,025,592 is hereby incorporated by reference into the specification of the present invention.

U.S. Pat. No. 6,407,850, entitled "AUTO TILT STAGE," discloses a device for tilting a sample stage to multiple positions. The present invention does not tilt a sample stage to multiple positions. U.S. Pat. No. 6,407,850 is hereby incorporated by reference into the specification of the present invention.

SUMMARY OF THE INVENTION

It is an object of the present invention to obtain the image resolution of a scanning transmission electron microscope in a less expensive scanning electron microscope.

It is another object of the present invention to obtain the image resolution of a scanning transmission electron microscope in a less expensive scanning electron microscope by using a graphite collimator and a two-stage reflector.

The present invention is a sample-stage for obtaining the image resolution of a scanning transmission electron microscope in a less expensive scanning electron microscope.

The sample stage includes a base, a horizontal support member, a vertical support member, a collimator, a first reflector, and a second reflector.

The base has a left end, a right end, and a top surface.

The horizontal support member has a left end, a right end, a top surface, a bottom surface, and a first aperture perpendicular to the top surface and between the left end and the right end.

The vertical support member has a bottom surface, a top surface, a left side, and a right surface. The bottom surface of the vertical support member abuts the left side and top surface of the base. The top surface of the vertical support member abuts the left end and bottom surface of the horizontal support member so that a portion of the right surface of the vertical support member is directly below the first aperture of the horizontal support member. The right surface of the vertical support member nearest the top surface of the vertical support member is to the left of the first aperture of the horizontal support member. The right surface of the vertical support member nearest the bottom surface of the vertical support member is to the right of the first aperture of the horizontal support member to form a user-definable.

The first reflector, which abuts the right surface of the vertical support member, is a layer of a suitably high atomic number material.

The second reflector, which abuts the portion of the top surface of the base that is not covered by the vertical support member, is a layer of a suitably high atomic number material.

The collimator has a top surface, a bottom surface, a left side, a right side, and a second aperture perpendicular to the top surface and completely through the. The bottom surface of the collimator abuts the top surface of the horizontal support member so that the first aperture of the horizontal support member and the second aperture of the collimator are in alignment.

DETAILED DESCRIPTION

The present invention is a sample-stage for a scanning electron microscope (SEM) to improve the image resolution of the SEM to that of the more expensive scanning transmission electron microscope (STEM). STEMs, which cost approximately ten times that of a SEM, capture higher resolution images than those captured by an unmodified SEM. The present invention is a sample-stage that can be used in a SEM to enable the SEM to capture images of approximately the same resolution as a STEM.

Figure 1:
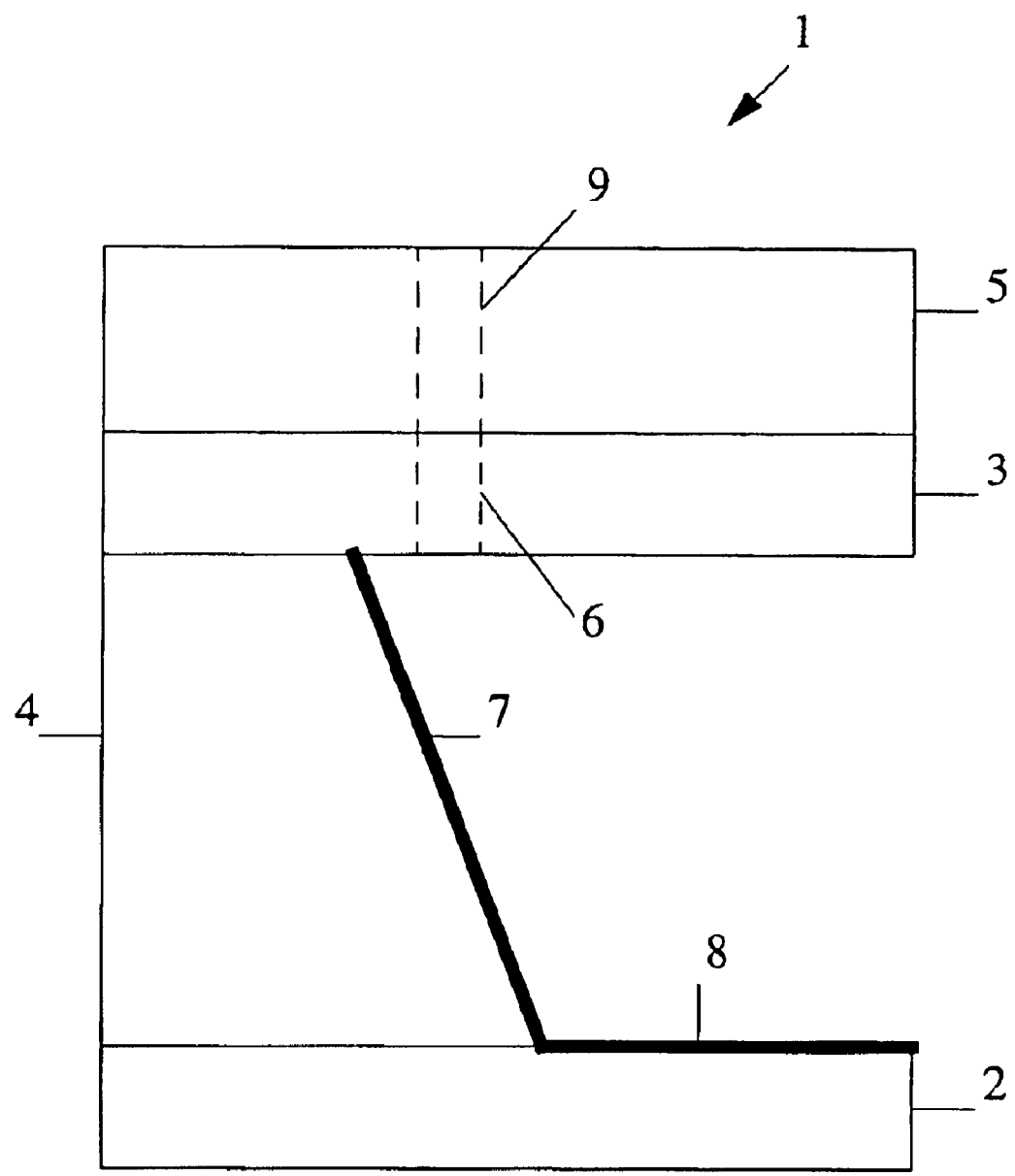
FIG. 1 is a side-view of the present invention.

FIG. 1 is a side-view of the best mode of the sample-stage 1 of the present invention.

The sample stage 1, which is to be used in a SEM (not shown), includes a base 2, a horizontal support member 3, a vertical support member 4, a collimator 5, a first reflector 7, and a second reflector 8.

The base 2 has a left end, a right end, and a top surface. The base 2 has a user-definable length, height, width, and material. In the preferred embodiment, the base 2 is 10 mm long, 2 mm high, 10 mm wide, and is made of aluminum.

The horizontal support member 3 has a left end, a right end, a top surface, a bottom surface, and a first aperture 6 perpendicular to the top surface and between the left end and the right end. The first aperture 6 extends completely through the horizontal support member 3. The horizontal support member 3 has a user-definable length, height, width, first aperture 6 diameter, and material. In the preferred embodiment, the horizontal support member 3 is 10 mm long, 2 mm high, 10 mm wide, has a first aperture 6 diameter of 1 mm, and is made of aluminum.

The vertical support member 4 has a bottom surface, a top surface, a left side, and a right surface. The bottom surface of the vertical support member 4 abuts the left side and top surface of the base 2. The top surface of the vertical support member 4 abuts the left end and bottom surface of the horizontal support member 3 so that a portion of the right surface of the vertical support member 4 is directly below the first aperture 6 of the horizontal support member 3. The right surface of the vertical support member 4 nearest the top surface of the vertical support member 4 is to the left of the first aperture 6 of the horizontal support member 3. The right surface of the vertical support member 4 nearest the bottom surface of the vertical support member 4 is to the right of the first aperture 6 of the horizontal support member 3. Therefore, the right surface of the vertical support member 4 is at a user-definable angle as compared to the left side of the vertical support member 4. In the preferred embodiment, the angle of the right surface of the vertical support member 4 is 10 degrees. The vertical support member 4 also has a user-definable height, width, and material. In the preferred embodiment, the vertical support member 4 has a height of 10 mm a width of 10 mm, and is made of aluminum.

The first reflector 7 is formed on the right surface of the vertical support member 4 by abutting a suitably high atomic number material onto the right surface of the vertical support member 4. In the preferred embodiment, first reflector 8 is a 1 micron thickness of a suitably high atomic number material selected from the group of suitable high atomic number materials consisting of gold, tungsten, platinum, and lead on a silicon substrate. Each of the suitably high atomic number materials strongly reflect electrons from the collimated e-beam 10, depicted in FIG. 2, that has passed through the sample 11 to be imaged.

The second reflector 8, depicted in FIG. 1, is formed on the portion of the top surface of the base 2 that is not covered by the vertical support member 4 by abutting a suitably high atomic number material onto the right surface of the vertical support member 4. In the preferred embodiment, the second reflector 8 is a 1 micron thickness of a suitably high atomic number material selected from the group of suitable high atomic number materials consisting of gold, tungsten, platinum, and lead on a silicon substrate.

Figure 2:
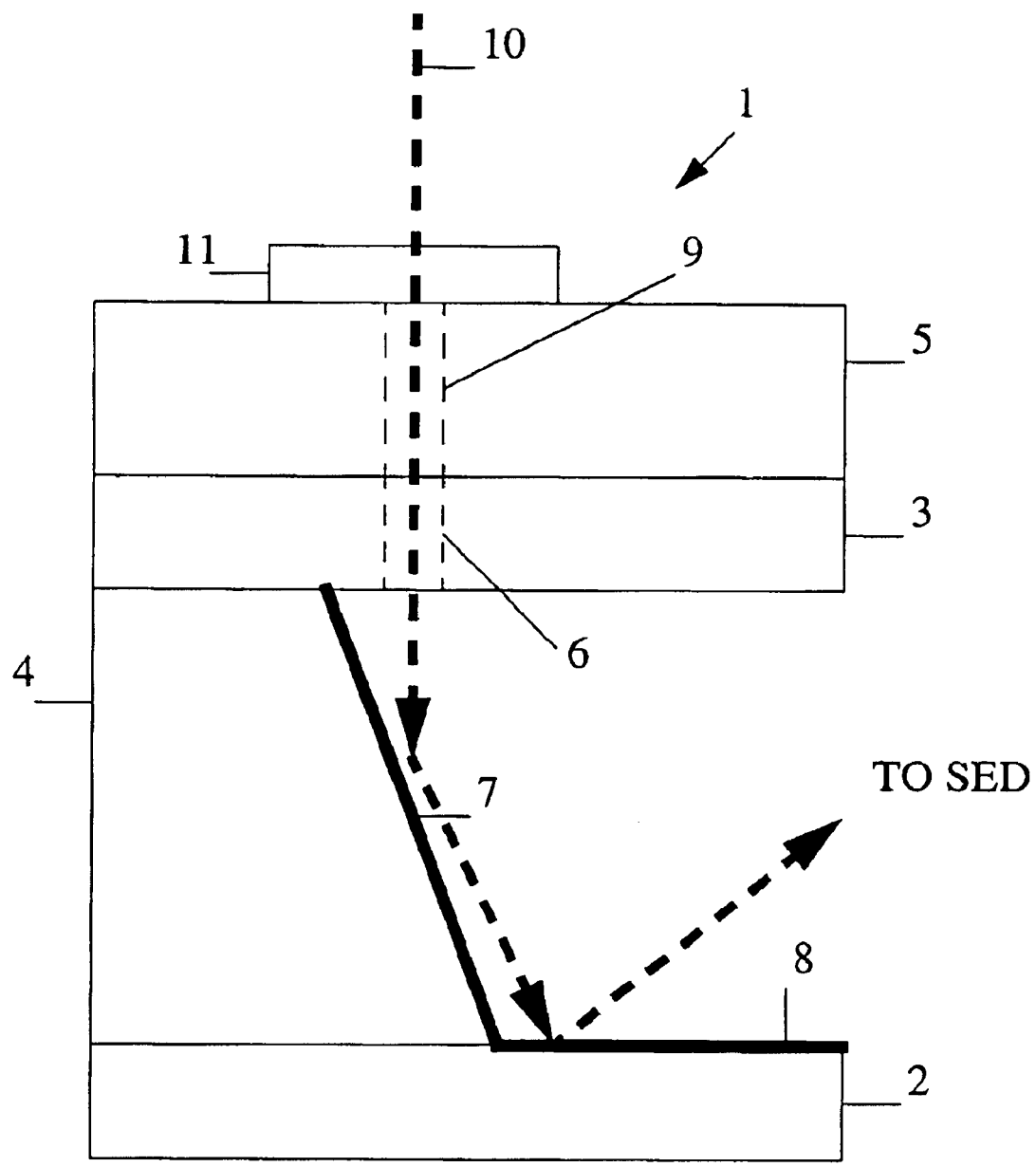
FIG. 2 is a side-view of the present invention showing its operation.

The first reflector 7 and the second reflector 8 form a two-stage reflector that strongly reflects electrons from the collimated e-beam 10 that has passed through the sample 11 to be imaged and, therefore, causes additional electrons to be directed toward the secondary emission detector (SED), as depicted in FIG. 2. Additional electrons received by the SED increases the resolution of the resulting image.

The collimator 5, as depicted in FIG. 1, has a top surface, a bottom surface, a left side, a right side, and a second aperture 9 perpendicular to the top surface and completely through the collimator 5 over which a sample to be imaged will rest. The second aperture 9 has an aperture diameter in the range of from 0.6 mm to 1.0 mm. The bottom surface of the collimator 5 abuts the top surface of the horizontal support member 3 so that the first aperture 6 of the horizontal support member 3 and the second aperture 9 of the collimator 5 are in alignment. The collimator 5 collimates an e-beam from the SEM, which has passes through the sample to be imaged. The collimator 5 is of a material, such as graphite, that absorbs electrons that stray from the path established by the second aperture 9. Absorbing electrons that stray from the path established by the second aperture 9 reduces glare in the resulting image and, therefore, increases image resolution.

What is claimed is:

1. A sample-stage for a scanning electron microscope, comprising:

(a) a base, having a left end, a right end, a top surface;

(b) a horizontal support member, having a left end, a right end, a top surface, a bottom surface, a first aperture perpendicular to the top surface and between the left end and the right end which extends completely through the horizontal support member;

(c) a vertical support member, having a bottom surface, a top surface, a left side, and a right surface, where the bottom surface of the vertical support member abuts the left side and top surface of the base, where the top surface of the vertical support member abuts the left end and bottom surface of the horizontal support member so that a portion of the right surface of the vertical support member is directly below the first aperture of the horizontal support member, where the right surface of the vertical support member nearest the top surface of the vertical support member is to the left of the first aperture of the horizontal support member, and where the right surface of the vertical support member nearest the bottom surface of the vertical support member is to the right of the first aperture of the horizontal support member so that the right surface of the vertical support member is at a user-definable angle as compared to the left side of the vertical support member;

(d) a collimator, having a top surface, a bottom surface, a left side, a right side, and a second aperture perpendicular to the top surface and completely through the collimator, where the second aperture has a diameter equal to that of the first aperature of the horizontal support member, where the bottom surface of the collimator abuts the top surface of the horizontal support member so that the first aperture and the second aperture are in alignment, and where the collimator is of a material that absorbs electrons incident therewith;

(e) a first reflector, abutting the right surface of the vertical support member, where the first reflector is of a suitably high atomic number material; and (f) a second reflector, abutting a portion of the top surface of the base that is not covered by the vertical support member, where the second reflector is made of a suitably high atomic number material.

2. The device of claim 1, wherein the base comprises a base that is 10 mm long, 2 mm high, and is made of aluminum.

3. The device of claim 2, wherein the horizontal support member comprises a horizontal support member that is 10 mm long, 2 mm high, has a first aperture diameter of 1 mm, and is made of aluminum.

4. The device of claim 3, wherein the vertical support member is comprised of a vertical support member having a height of 10 mm, is made of aluminum, and the right surface is at an angle in of 10 degrees.

5. The device of claim 4, wherein the collimator is comprised of graphite.

6. The device of claim 5, wherein the first reflector and the second reflector are each comprised of:

(a) a silicon substrate; and (b) a suitably high atomic number material of 1 micron thickness selected from the group of suitable high atomic number materials consisting of gold, tungsten, platinum, and lead, deposited onto the silicon substrate.

7. The device of claim 1, wherein the horizontal support member comprises a horizontal support member that is 10 mm long, 2 mm high, has a first aperture diameter of 1 mm, and is made of aluminum.

8. The device of claim 1, wherein the vertical support member is comprised of a vertical support member having a height of 10 mm, is made of aluminum, and the right surface is at an angle in of 10 degrees.

9. The device of claim 1, wherein the collimator is comprised of graphite.

10. The device of claim 1, wherein the first reflector and the second reflector are each comprised of:

(a) a silicon substrate; and (b) a suitably high atomic number material of 1 micron thickness selected from the group of suitable high atomic number materials consisting of gold, tungsten, platinum, and lead, deposited onto the silicon substrate.

* * * * *